(12) United States Patent
Wang et al.

(10) Patent No.: US 10,629,631 B2
(45) Date of Patent: Apr. 21, 2020

(54) DISPLAY PANEL STRUCTURE

(71) Applicant: Century Technology (Shenzhen) Corporation Limited, Shenzhen (CN)

(72) Inventors: Ming-Tsung Wang, New Taipei (TW); Chih-Chung Liu, New Taipei (TW); Yi-Hsiu Cheng, New Taipei (TW); Wen-Qiang Yu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 16/380,276

(22) Filed: Apr. 10, 2019

(65) Prior Publication Data
US 2019/0237484 A1 Aug. 1, 2019

Related U.S. Application Data

(62) Division of application No. 14/947,070, filed on Nov. 20, 2015, now Pat. No. 10,297,616.

(30) Foreign Application Priority Data

Sep. 14, 2015 (CN) .......................... 2015 1 0580737

(51) Int. Cl.
*H01L 27/12* (2006.01)
*G02F 1/1368* (2006.01)
*H01L 29/417* (2006.01)

(52) U.S. Cl.
CPC .......... *H01L 27/124* (2013.01); *G02F 1/1368* (2013.01); *H01L 29/41733* (2013.01)

(58) Field of Classification Search
CPC .. H01L 27/124; H01L 29/4173; G02F 1/1368
See application file for complete search history.

(56) References Cited

U.S. PATENT DOCUMENTS

2014/0043372 A1* 2/2014 Xi ..................... H01L 27/326
345/690
2015/0235599 A1* 8/2015 Cho .................... H01L 27/1288
345/206

\* cited by examiner

*Primary Examiner* — Yosef Gebreyesus
(74) *Attorney, Agent, or Firm* — ScienBiziP, P.C.

(57) ABSTRACT

A display panel includes a gate integrated circuit, a number of scan lines extending from the gate integrated circuit for transmitting scan signals, a source integrated circuit, a number of data lines extending from the source integrated circuit for transmitting data signals, a number of pixel electrodes for receiving the scan signals and the data signals, and a number of transistors each electrically coupled to a corresponding scan line, a corresponding data line, and a corresponding pixel electrode. The transistors each include a gate electrode, a source electrode, and a drain electrode. The drain electrode includes an overlapping portion overlapping with the gate electrode. The gate integrated circuit transmits the scan signals along the scan lines. A size of the overlapping portion increases along a transmitting direction of the scan signal along the scan line.

18 Claims, 7 Drawing Sheets

DISPLAY PANEL STRUCTURE

CROSS-REFERENCE TO RELATED APPLICATIONS

This application is a divisional/continuation application of U.S. Ser. No. 14/947,070, filed Nov. 20, 2015 the contents of which are hereby incorporated by reference. The patent application Ser. No. 14/947,070 in turn claims priority from Chinese Patent Application No. 201510580737.X filed on Sep. 14, 2015.

FIELD

The subject matter herein generally relates to display panels, and more particularly to a liquid crystal display panel.

BACKGROUND

Generally, a display panel includes a gate integrated circuit and pixels located at different distances away from the gate integrated circuit.

BRIEF DESCRIPTION OF THE DRAWINGS

Implementations of the present technology will now be described, by way of example only, with reference to the attached figures.

DETAILED DESCRIPTION

Figure 1:
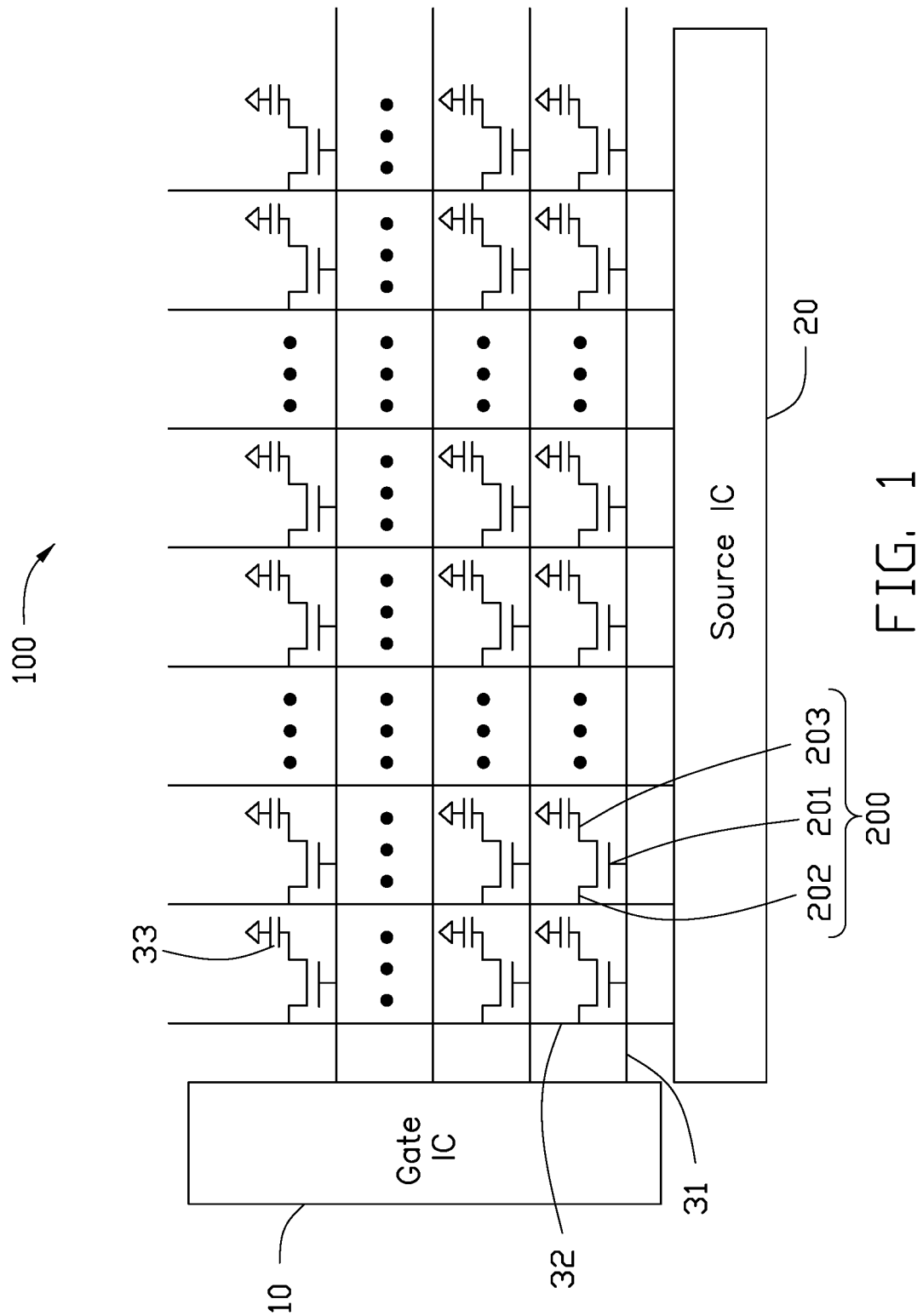
FIG. 1 is a diagrammatic, circuit view of an exemplary embodiment of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series and the like.

FIG. 1 illustrates an embodiment of a display panel 100. The display panel 100 can include a gate integrated circuit (gate IC) 10, a source integrated circuit (source IC) 20, and a transistor substrate (not labeled). The transistor substrate can include a plurality of scan lines 31, a plurality of data lines 32, a plurality of pixel electrodes 33, and a plurality of thin film transistors (TFTs) 200. Each TFT 200 can be electrically coupled to a corresponding scan line 31, a corresponding data line 32, and a corresponding pixel electrode 33. The scan lines 31 can extend away from the gate IC 10, and the data lines 32 can extend away from the source IC 20. The gate IC 10 can transmit a scan signal through each of the scan lines 31, and the source IC 20 can transmit a data signal through each of the data lines 32. The plurality of TFTs 200 can form a plurality of transistor units (not labeled). Each transistor unit is made up of a predetermined number of transistors and is arranged along one corresponding scan line 31.

The TFT 200 can include a gate electrode 201 coupled to the corresponding scan line 31, a source electrode 202 coupled to the corresponding data line 32, and a drain electrode 203 coupled to the pixel electrode 33. The display panel 100 of the present disclosure can have an improved display quality by ensuring that a voltage is supplied uniformly to all of the transistors 200. The voltage can be supplied to each transistor 200 according to an overlapping portion 30 of the drain electrode 203 of the corresponding TFT 200 with the gate electrode 201.

Figure 2:
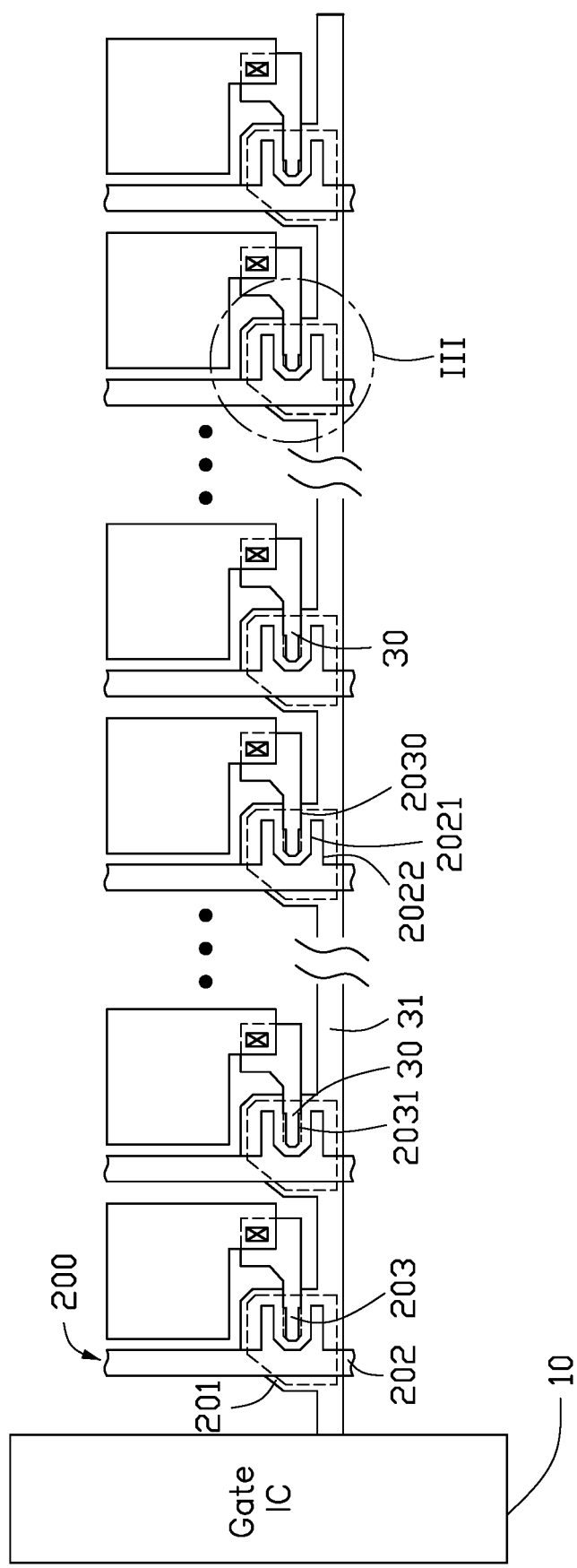
FIG. 2 is a diagrammatic, plan view of a first embodiment of a transistor unit of the display panel in FIG. 1.

FIG. 2 illustrates a first embodiment of the plurality of transistor units. For simplicity and clarity of illustration, FIG. 2 only illustrates one transistor unit. The overlapping portion 30 of each drain electrode 203 can include two outer surfaces 2030 located at opposite sides of the overlapping portion 30. The source electrode 202 can be substantially U-shaped and include two arm portions (not labeled) located on opposite sides of the drain electrode. Each arm portion can include a first surface 2021 and a second surface 2022. The first surface 2021 can face the corresponding outer surface 2030 of the drain electrode 203. The second surface 2022 can face away from the drain electrode 203. In the first embodiment, designated drain electrodes 203 of the transistor unit can define a cutout 2031 in the outer surfaces 2030. A size of the cutout 2031 in the drain electrodes 203 decreases with an increase of a distance between the drain electrode 203 and a starting transmission point of the scan signal at the gate IC 10. Thus, a total surface area of the overlapping portion 30 of the drain electrodes 203 overlapping with the gate electrode 201 increases as the size of the cutout 2031 decreases. In at least one embodiment, the cutout 2031 of each drain electrode 203 is defined in portions of the outer surfaces 2030 of the drain electrode 203 located most adjacent to the starting transmission point of the scan signal.

Figure 3:
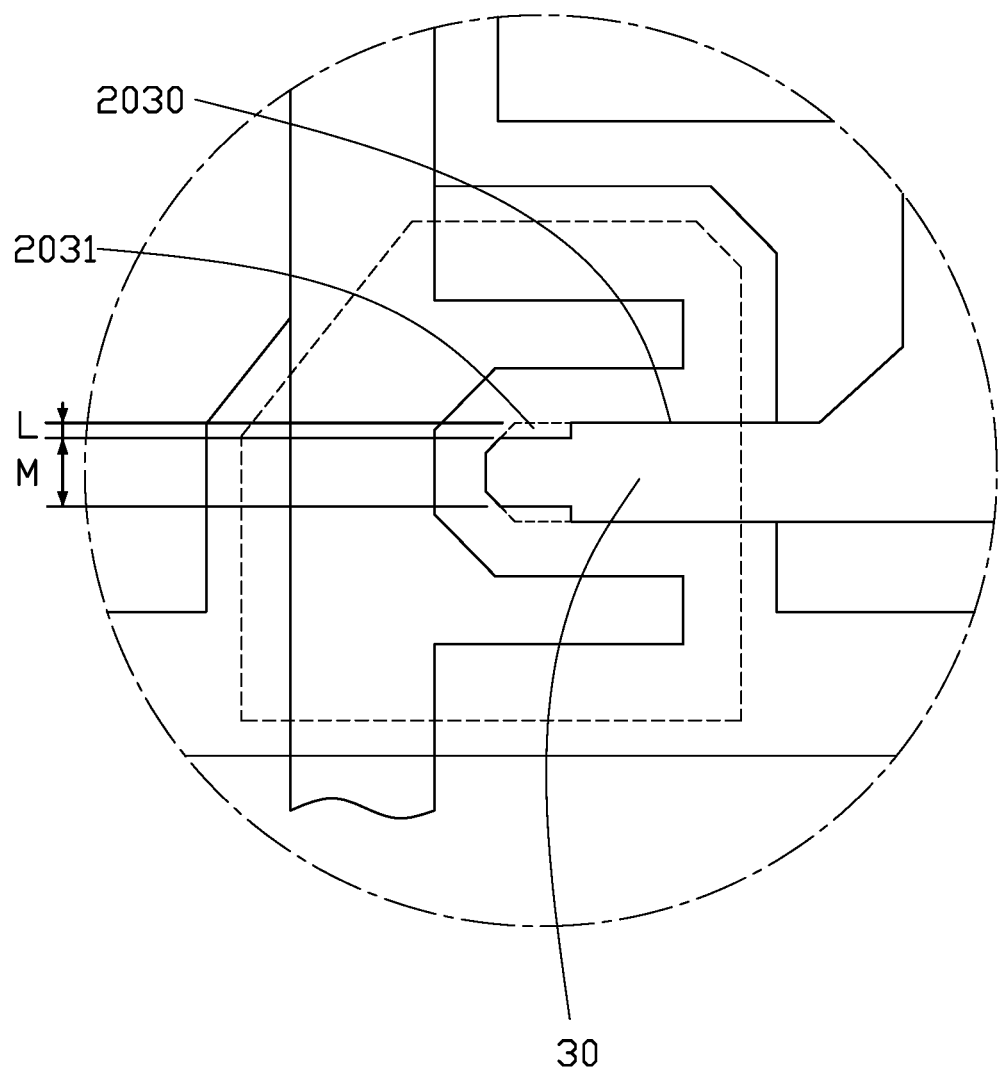
FIG. 3 is a diagrammatic, plan view of a second embodiment of a transistor unit of the display panel in FIG. 1.

As illustrated in FIG. 3, the cutout 2031 can have a depth of L, and the drain electrode 203 can have a distance M between two opposite cutouts 2031. In at least one embodiment, the depth L of the cutouts 2031 is about 0.2 micrometers, and the distance M is not less than about 4.3 micrometers.

Figure 4:
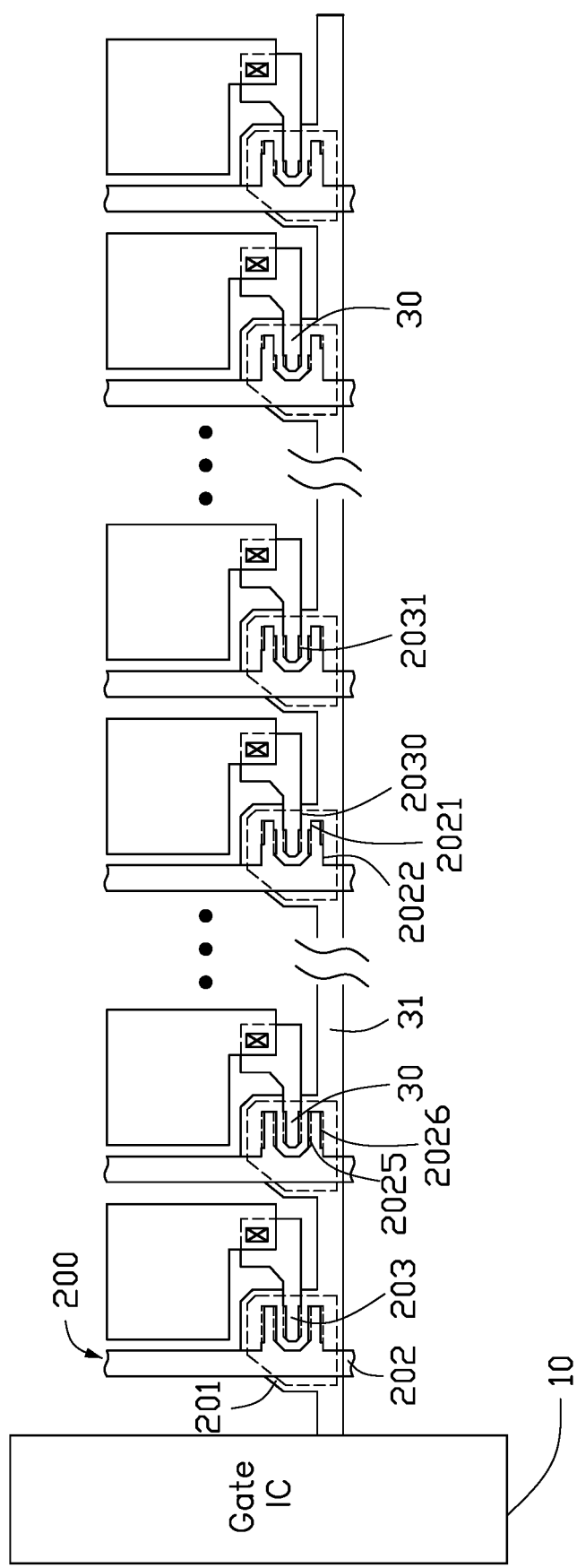
FIG. 4 is a diagrammatic, plan view of a third embodiment of a transistor unit of the display panel in FIG. 1.

FIG. 4 illustrates a second embodiment of the plurality of TFTs 200. The second embodiment can be substantially similar to the first embodiment. In the second embodiment, the source electrode 202 can form a step 2025 on each first surface 2021. The step 2025 can be directly opposite to the cutout 2031. A distance between the step 2025 and the cutout 2031 can be substantially equal to a distance between the outer surface 2030 and the corresponding first surface 2021.

Thus, a uniform distance between the first surface 2021 and the outer surface 2031 is maintained. The source electrode 202 can define a second cutout 2026 in each second surface 2022. A depth and a size of the second cutout 2026 can be substantially equal to the height of the step 2025. Thus, a cross-sectional surface area of the source electrode 202 is maintained.

Figure 5:
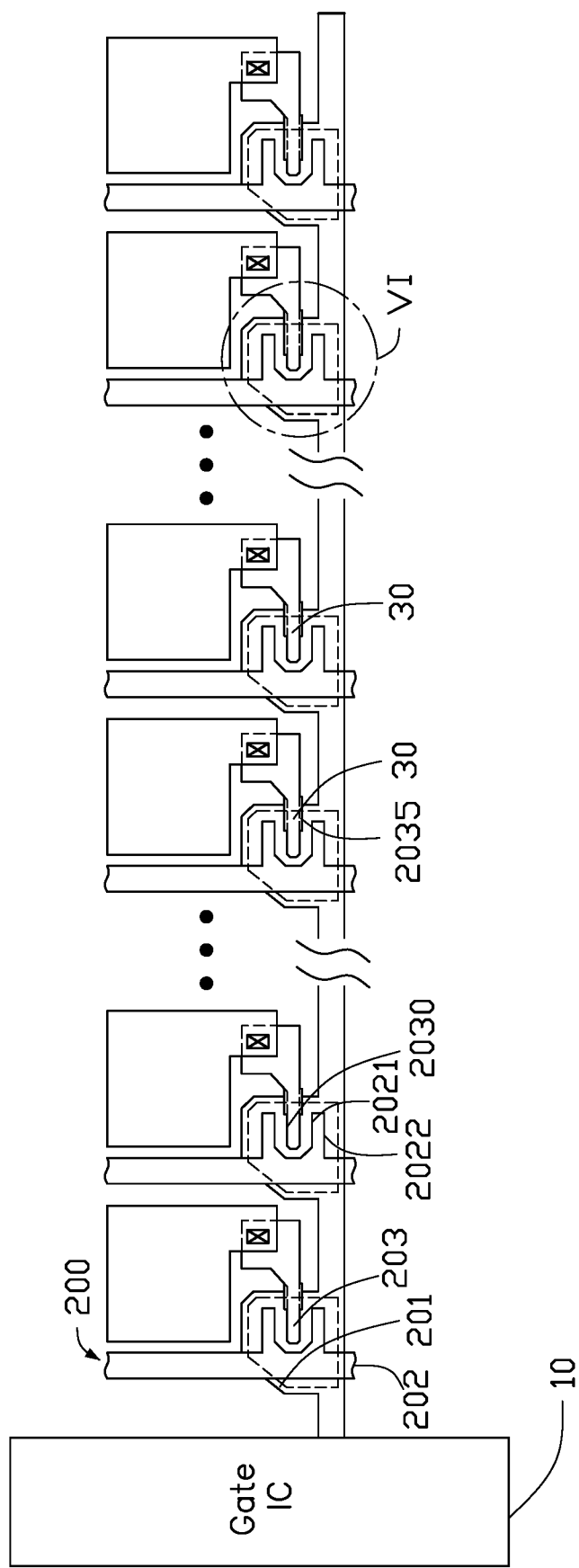
FIG. 5 is a diagrammatic, plan view of a fourth embodiment of a transistor unit of the display panel in FIG. 1.

FIG. 5 illustrates a third embodiment of the plurality of TFTs 200. For simplicity and clarity of illustration, FIG. 5 only illustrates the TFTs 200 of one row of pixel units. The overlapping portion 30 of each drain electrode 203 can include two outer surfaces 2030 located at opposite sides of the overlapping portion 30. The source electrode 202 can be substantially U-shaped and include two arm portions (not labeled) located on opposite sides of the drain electrode. Each arm portion can include a first surface 2021 and a second surface 2022. The first surface 2021 can face the corresponding outer surface 2030 of the drain electrode 203. The second surface 2022 can face away from the drain electrode 203. In the third embodiment, designated drain electrodes 203 of the transistor unit form a step 2035 on the outer surfaces 2030. A size of the step 2035 formed on each drain electrode 203 can be determined by a distance of the drain electrode 203 on the scan line 31 away from a starting transmission point of the scan signal at the gate IC 10. In at least one embodiment, the size of the step 2035 on the drain electrodes 203 increases with an increase of a distance between the drain electrode 203 and the starting transmission point of the scan signal. Thus, a total surface area of the overlapping portion 30 of the drain electrodes 203 overlapping with the gate electrode 201 increases as the size of the step 2035 on the drain electrodes 203 increases. In at least one embodiment, the step 2035 of each drain electrode 203 is formed on portions of the outer surfaces 2030 of the drain electrode 203 located farthest away from the starting transmission point of the scan signal.

Figure 6:
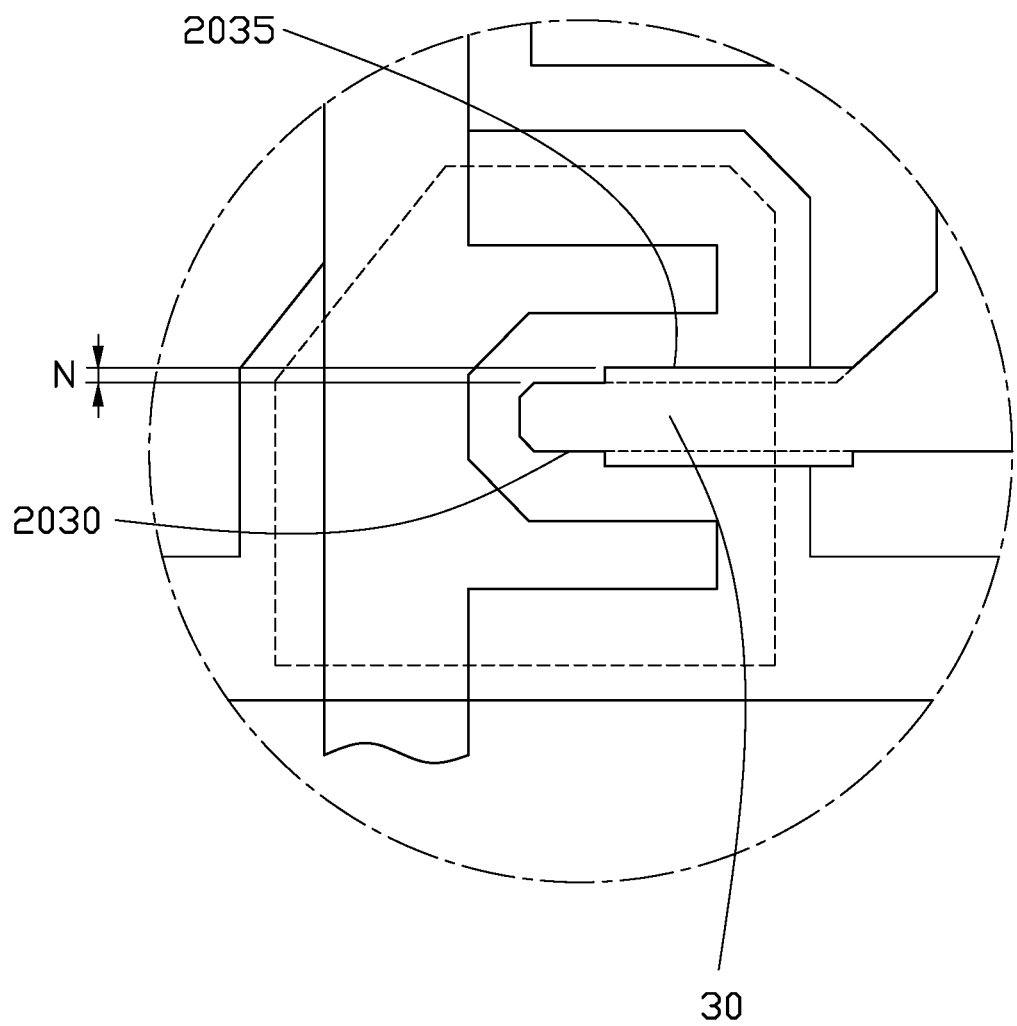
FIG. 6 is a diagrammatic, plan view of a fifth embodiment of a transistor unit of the display panel in FIG. 1.

As illustrated in FIG. 6, a height N of the step 2035 is about 0.2 micrometers.

Figure 7:
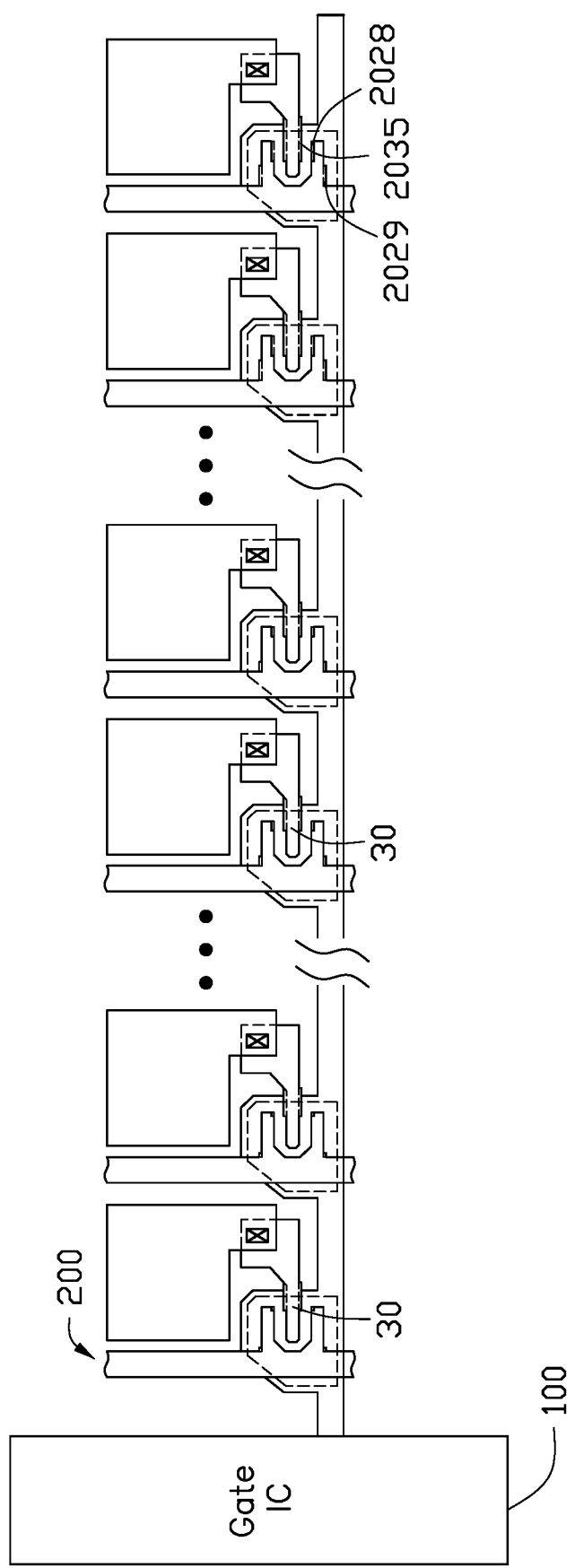
FIG. 7 is a diagrammatic, plan view of a sixth embodiment of a transistor unit of the display panel in FIG. 1.

FIG. 7 illustrates a fourth embodiment of the plurality of TFTs 200. The fourth embodiment can be substantially similar to the third embodiment. In the fourth embodiment, the source electrode 202 can define a cutout 2028 in each first surface 2021. The cutout 2028 can be located directly opposite to the step 2035. A distance between the cutout 2028 and the step 2035 can be substantially equal to a distance between the outer surface 2030 and the corresponding first surface 2021. Thus, a uniform distance between the first surface 2021 and the outer surface 2031 is maintained. The source electrode 202 can form a second step 2029 on each second surface 2022. A height and size of the second step 2029 can be substantially equal to the depth of the cutout 2028. Thus, a cross-sectional area of the source electrode 202 is maintained.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:
1. A display panel comprising:
a gate integrated circuit;
a plurality of scan lines, each of the plurality of scan lines extending in a first direction and comprising a first end and a second end opposite to the first end, the first end of the each of the plurality of scan lines electrically coupled to the gate integrated circuit; the second end being away from the gate integrated circuit;
a plurality of transistors; each of the plurality of transistors comprising a gate electrode, a source electrode, and a drain electrode, the gate electrode electrically coupled to one of the plurality of scan lines, the source electrode and the drain electrode stacked on the gate electrode, the drain electrode comprising an overlapping portion, the entire overlapping portion overlapping the gate electrode;
wherein the plurality of transistors forms a plurality of transistor units, each of the plurality of transistor units comprises at least six of the plurality of transistors arranged along and electrically coupled to one of the plurality of scan lines; each of the plurality of transistor units comprises at least six overlapping portions arranged along one of the plurality of scan lines;
wherein a size of each of the overlapping portions in each of the plurality of transistor units is different from each other;
wherein the size of the overlapping portions in each of the plurality of transistor units increase along a direction from the first end toward the second end; and
wherein the overlapping portion of each of the drain electrodes comprises an outer surface.

2. The display panel as in claim 1, wherein:
each of the source electrodes comprises two arm portions located on opposite sides of the drain electrode;
each of the arm portions comprises a first surface and a second surface;
the first surface faces the corresponding outer surface of the drain electrode; and
the second surface faces away from the drain electrode.

3. The display panel as in claim 2, wherein:
designated drain electrodes of the transistor unit form a step on the outer surfaces;
a size of the step formed on each drain electrode is determined by a distance of the drain electrode on the scan line away from a starting transmission point of the scan signal at the gate integrated circuit; and
a size of the step on the drain electrodes increases with an increase of a distance between the drain electrode and the starting transmission point of the scan signal.

4. The display panel as in claim 3, wherein the step of each drain electrode is formed on portions of the outer surfaces of the drain electrode located farthest away from the starting transmission point of the scan signal.

5. The display panel as in claim 3, wherein:
the source electrode defines a cutout in each of the first surface;
the cutout is located directly opposite to the step; and
a distance between the cutout and the step is substantially equal to a distance between the outer surface and the corresponding first surface.

6. The display panel as in claim 5, wherein:
the source electrode forms a second step on each of the second surface; and
a height of the second step is substantially equal to the depth of the cutout.

7. The display panel as in claim 2, wherein:
designated drain electrodes of the transistor unit define a cutout in the outer surface; and a size of the cutout in the drain electrodes decreases with an increase of a distance between the drain electrode and a starting transmission point of the scan signal at the gate integrated circuit.

8. The display panel as in claim 7, wherein:
the source electrode defines a cutout in each of the first surface;
the cutout is located directly opposite to the step; and
a distance between the cutout and the step is equal to a distance between the outer surface and the corresponding first surface.

9. The display panel as in claim 8, wherein:
the source electrode forms a second step on each of the second surface; and
a height of the second step is equal to the depth of the cutout.

10. A transistor substrate of a display panel, the transistor substrate comprising:
a gate integrated circuit;
a plurality of scan lines, each of the plurality of scan lines extending in a first direction and comprising a first end and a second end opposite to the first end, the first end of the each of the plurality of scan lines electrically coupled to the gate integrated circuit; the second end being away from the gate integrated circuit;
a plurality of transistors; each of the plurality of transistors comprising a gate electrode, a source electrode, and a drain electrode, the gate electrode electrically coupled to one of the plurality of scan lines, the source electrode and the drain electrode stacked on the gate electrode, the drain electrode comprising an overlapping portion, the entire overlapping portion overlapping the gate electrode;
wherein the plurality of transistors forms a plurality of transistor units, each of the plurality of transistor units comprises at least six of the plurality of transistors arranged along and electrically coupled to one of the plurality of scan lines; each of the plurality of transistor units comprises at least six overlapping portions arranged along one of the plurality of scan lines;
wherein a size of each of the overlapping portion in each of the plurality of transistor units is different from each other;
wherein the size of the overlapping portions in each of the plurality of transistor units increase along a direction from the first end toward the second end; and
wherein the overlapping portion of each of the drain electrode comprises an outer surface.

11. The transistor substrate as in claim 10, wherein:
each of the source electrode comprises two arm portions located on opposite sides of the drain electrode;
each of the arm portions comprises a first surface and a second surface;
the first surface faces the corresponding outer surface of the drain electrode; and
the second surface faces away from the drain electrode.

12. The transistor substrate as in claim 11, wherein:
designated drain electrodes of the transistor unit form a step on the outer surfaces;
a size of the step formed on each of the drain electrode is determined by a distance of the drain electrode on the scan line away from a starting transmission point of the scan signal at the gate integrated circuit; and
the size of the step on the drain electrodes increases with an increase of a distance between the drain electrode and the starting transmission point of the scan signal.

13. The transistor substrate as in claim 12, wherein the step of each of the drain electrode is formed on portions of the outer surfaces of the drain electrode located farthest away from the starting transmission point of the scan signal.

14. The transistor substrate as in claim 12, wherein:
the source electrode defines a cutout in each of the first surface;
the cutout is located directly opposite to the step; and
a distance between the cutout and the step is substantially equal to a distance between the outer surface and the corresponding first surface.

15. The transistor substrate as in claim 14, wherein:
the source electrode forms a second step on each of the second surface; and
a height and a size of the second step are substantially equal to a depth of the cutout.

16. The transistor substrate as in claim 11, wherein:
designated drain electrodes of the transistor unit define a cutout in the outer surface; and
a size of the cutout in the drain electrodes decreases with an increase of a distance between the drain electrode and a starting transmission point of the scan signal at the gate integrated circuit.

17. The transistor substrate as in claim 16, wherein:
the source electrode defines a cutout in each of the first surface;
the cutout is located directly opposite to the step; and
a distance between the cutout and the step is equal to a distance between the outer surface and the corresponding first surface.

18. The transistor substrate as in claim 17, wherein:
the source electrode forms a second step on each of the second surface; and
a height of the second step is equal to a depth of the cutout.

* * * * *